(12) United States Patent
Scott et al.

(10) Patent No.: US 12,170,507 B2
(45) Date of Patent: Dec. 17, 2024

(54) PROTECTION CIRCUIT FOR ACOUSTIC FILTER AND POWER AMPLIFIER STAGE

(71) Applicant: Qorvo US, Inc., Greensboro, NC (US)

(72) Inventors: Baker Scott, San Jose, CA (US);
George Maxim, Saratoga, CA (US);
Stephen James Franck, Felton, CA (US); Hui Liu, San Diego, CA (US);
Jungmin Park, San Jose, CA (US)

(73) Assignee: Qorvo US, Inc.

( * ) Notice: Subject to any disclaimer, the term of this patent is extended or adjusted under 35 U.S.C. 154(b) by 236 days.

(21) Appl. No.: 17/589,078

(22) Filed: Jan. 31, 2022

(65) Prior Publication Data

US 2023/0246601 A1    Aug. 3, 2023

(51) Int. Cl.
*H03F 1/52* (2006.01)
*H03F 3/24* (2006.01)

(52) U.S. Cl.
CPC .............. *H03F 1/52* (2013.01); *H03F 3/245* (2013.01); *H03F 2200/171* (2013.01); *H03F 2200/426* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 4,908,604 A * | 3/1990 | Jacob | .................... | G08B 19/00 340/5.2 |
| 10,324,171 B2 * | 6/2019 | Niclass | .................... | G01S 17/10 |
| 10,938,355 B2 * | 3/2021 | Korol | .................... | H03F 1/0266 |
| 2003/0203717 A1 * | 10/2003 | Chuprun | ............ | H04B 7/18591 455/12.1 |
| 2011/0152729 A1 * | 6/2011 | Oohashi | ................ | A61M 21/02 601/2 |
| 2020/0212862 A1 * | 7/2020 | Hulsteijn | ............. | H04B 1/0458 |
| 2020/0284883 A1 * | 9/2020 | Ferreira | ............... | H04N 25/773 |
| 2023/0246601 A1 * | 8/2023 | Scott | ...................... | H03F 3/195 340/533 |

FOREIGN PATENT DOCUMENTS

| | | | | |
|---|---|---|---|---|
| CA | 2206520 C | * | 10/2000 | ............. G06K 1/128 |
| CA | 2642222 C | * | 9/2012 | ............. B60N 2/002 |
| CA | 2933166 C | * | 10/2020 | ........... A61B 5/0004 |
| CA | 3181720 A1 | * | 12/2021 | ............. H03F 3/195 |
| EP | 2660975 A1 | * | 11/2013 | ............. H01Q 1/246 |

OTHER PUBLICATIONS

Extended European Search Report for European Patent Application No. 23154024.6, mailed Jun. 26, 2023, 15 pages.

* cited by examiner

*Primary Examiner* — Fekadeselassie Girma
(74) *Attorney, Agent, or Firm* — Withrow & Terranova, P.L.L.C.

(57) ABSTRACT

A protection circuit for an acoustic filter and/or a power amplifier is disclosed. In one aspect, the protection circuit includes a bidirectional coupler that helps secure a measurement of power at an antenna. The power measurement is compared to a threshold by a detector, and if the power measurement is above the threshold, a signal is sent that causes debiasing of a power amplifier stage, which reduces power levels of signals being amplified by the power amplifier stage and correspondingly lowers the power level going through a filter associated with the power amplifier stage. By lowering the power level going through the power amplifier stage and the filter, both elements are protected against over power conditions allowing functionality to be maintained.

25 Claims, 9 Drawing Sheets

PROTECTION CIRCUIT FOR ACOUSTIC FILTER AND POWER AMPLIFIER STAGE

BACKGROUND

I. Field of the Disclosure

The technology of the disclosure relates generally to a protection circuit for protecting an acoustic filter from over power conditions.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. The explosion of functionality has led to demands for increased bandwidth capabilities, which in turn has led to the evolution of cellular standards through the second generation (2G) through, currently, the fifth generation (5G) and a proposed sixth generation (6G) as of this writing. Mobile computing devices that operate according to these various cellular standards typically include a transmitter having a transmission chain that includes a power amplifier stage and a filter to condition signals prior to transmission through an antenna. If too much power is applied to a power amplifier stage or a filter, such components may fail, which, in extreme cases may brick the mobile computing device. Accordingly, there is room for developing ways to preserve the functionality of the power amplifier stage and/or the filter.

SUMMARY

Aspects disclosed in the detailed description include a protection circuit for an acoustic filter and/or a power amplifier. In an exemplary aspect, the protection circuit includes a bidirectional coupler that helps secure a measurement of power at an antenna. The power measurement is compared to a threshold by a detector, and if the power measurement is above the threshold, a signal is sent that causes debiasing of a power amplifier stage, which reduces power levels of signals being amplified by the power amplifier stage and correspondingly lowers the power level going through a filter associated with the power amplifier stage. By lowering the power level going through the power amplifier stage and the filter, both elements are protected against over power conditions allowing functionality to be maintained.

In this regard in one aspect, a transmission chain is disclosed. The transmission chain comprises a power amplifier stage configured to receive a signal and output an amplified output signal. The transmission chain also comprises a bias circuit coupled to the power amplifier stage and configured to selectively bias and debias the power amplifier stage to control a power level of the amplified output signal. The transmission chain also comprises a filter coupled to the power amplifier stage and configured to receive the amplified output signal and output a filtered signal. The transmission chain also comprises a conductor coupled to the filter and configured to be coupled to an antenna. The transmission chain also comprises a coupler indirectly coupled to the conductor and configured to sense current indirectly on the conductor. The transmission chain also comprises a detection circuit coupled to the coupler and configured to generate an alert signal based on the current sensed by the coupler. The bias circuit is configured to debias the power amplifier stage based on the alert signal.

In another aspect, an integrated circuit (IC) is disclosed. The IC comprises an antenna switch configured to receive a signal from a filter. The IC also comprises a conductor coupled to the antenna switch and configured to be coupled to an antenna. The IC also comprises a coupler configured to sense current indirectly on the conductor. The IC also comprises a detection circuit coupled to the coupler and configured to generate an alert signal when a reflected signal exceeds a threshold. The alert signal is configured to trigger a debias of a power amplifier stage to protect the filter.

In another aspect, an IC is disclosed. The IC comprises a bias circuit. The IC also comprises a power amplifier stage coupled to the bias circuit. The IC also comprises an alert circuit configured to receive an alert signal from a detection circuit and cause the bias circuit to debias the power amplifier stage based on the alert signal.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a protection circuit for an acoustic filter and/or a power amplifier. In an exemplary aspect, the protection circuit includes a bidirectional coupler that helps secure a measurement of power at an antenna. The power measurement is compared to a threshold by a detector, and if the power measurement is above the threshold, a signal is sent that causes debiasing of a power amplifier stage, which reduces power levels of signals being amplified by the power amplifier stage and correspondingly lowers the power level going through a filter associated with the power amplifier stage. By lowering the power level going through the power amplifier stage and the filter, both elements are protected against over power conditions allowing functionality to be maintained.

Figure 1:
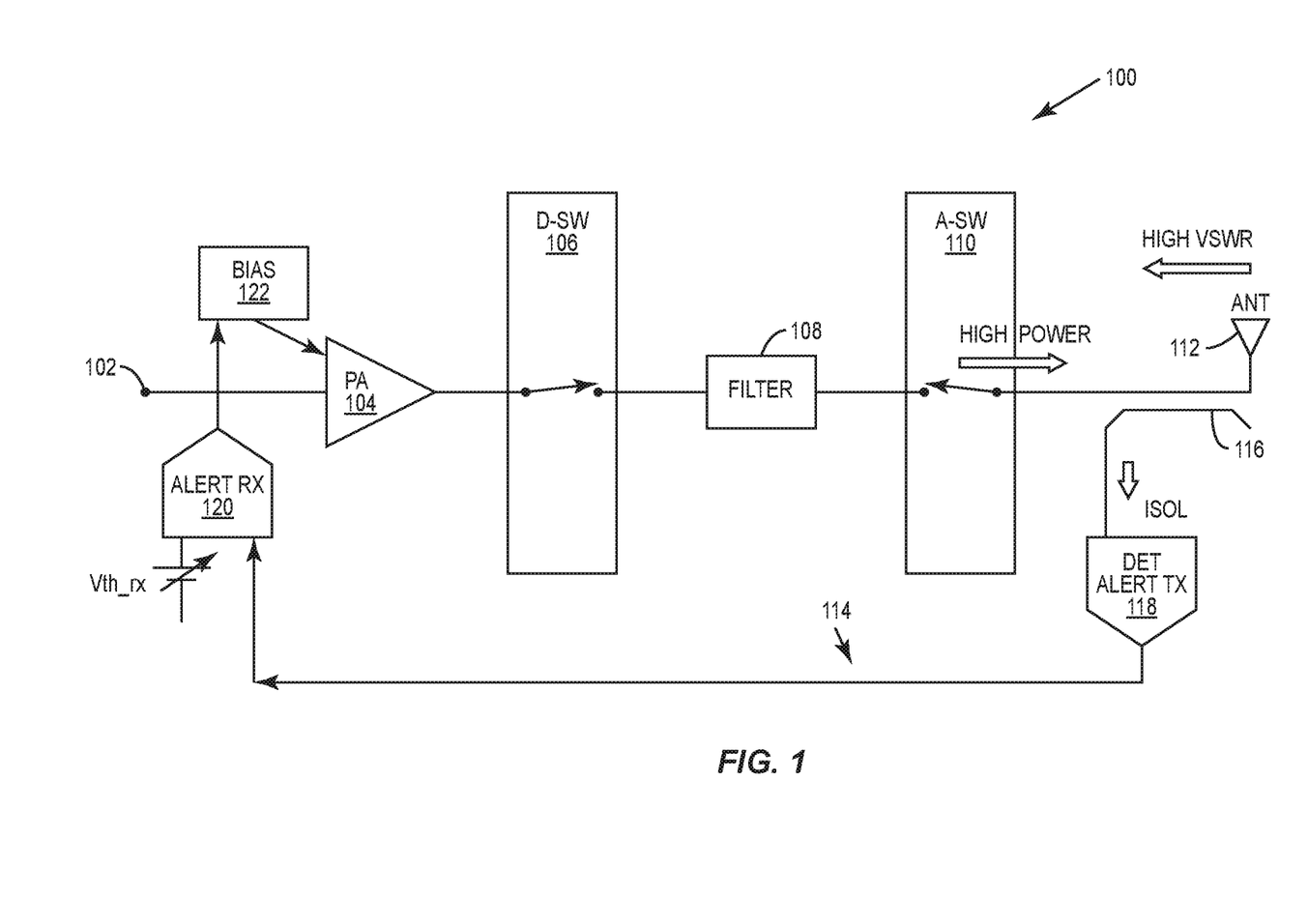
FIG. 1 is a block diagram of an exemplary transmission chain having a power amplifier stage and a filter and a protection circuit that protects one or both elements from an over power condition.

In this regard, FIG. 1 is a block diagram of a transmission chain 100 within a radio frequency (RF) mobile communication device (not specifically shown). The transmission chain 100 may be part of a transceiver or RF front end module or the like. Further, various elements of the transmission chain 100 may be instantiated as separate dies, part of a larger integrated circuit (IC) or the like as needed or desired. The transmission chain 100 has an input node 102 which is coupled to a power amplifier stage 104. An RF signal is received at the input node 102 and passes to the power amplifier stage 104 for amplification. The power amplifier stage 104 may be coupled to a distribution switch 106. The distribution switch 106 may be coupled to an acoustic filter 108 such as a surface acoustic wave (SAW) filter or bulk acoustic wave (BAW) filter. The filter 108 may be coupled to an antenna switch 110. The antenna switch 110 may be coupled to one or more antennas 112 (only one shown).

In normal operation, a signal at the input node 102 is amplified and passed to the antenna 112 for wireless transmission. The impedance of the elements in the transmission chain 100 are ideally matched to the impedance of the antenna 112, which is typically fifty ohms (50Ω). When such ideal impedance matching is present, all the power of any signal presented to the antenna 112 is radiated from the antenna 112. However, impedance is generally highly frequency dependent, and thus, changes in frequencies within the RF signal at the input node 102 may result in signals that see different impedances. When there is an impedance mismatch, some portion of the power in the signal being sent to the antenna 112 will be reflected from the antenna 112. A metric called a voltage standing wave ratio (VSWR) is sometimes used to describe such reflected power. VSWR is defined as the ratio between the transmitted and reflected voltage standing waves in an RF electrical transmission system. It is, effectively, a measurement of how efficiently RF power is transmitted. The higher the VSWR, the larger the reflection. When there is a large reflection, that may cause power to be dissipated through the filter 108 and/or the power amplifier stage 104. When too much power is dissipated through the filter 108, the filter 108 may fail. Failure of the filter 108 may degrade performance or even brick the transmission chain 100.

Exemplary aspects of the present disclosure mitigate the risk of failure of the filter 108 and/or failure of the power amplifier stage 104 by adding an over power protection loop 114 to the transmission chain 100. The over power protection loop 114 may include a coupler 116 that provides an indication of power levels reflected from the antenna 112. The over protection loop 114 may further include a detection circuit 118 that compares the detected power levels to a threshold and, if the threshold is exceeded, sends using transmit circuitry, a message to an alert circuit 120. The alert circuit 120 has sufficient receive circuitry to receive the message and send a signal to a bias circuit 122. The bias circuit 122 may debias or otherwise adjust a bias signal to the power amplifier stage 104 so as to decrease the power being sent into the filter 108 and correspondingly decrease any reflected power. Such a decrease in forward and reverse power passing through the filter 108 helps avoid damage to the filter 108.

Figure 2A:
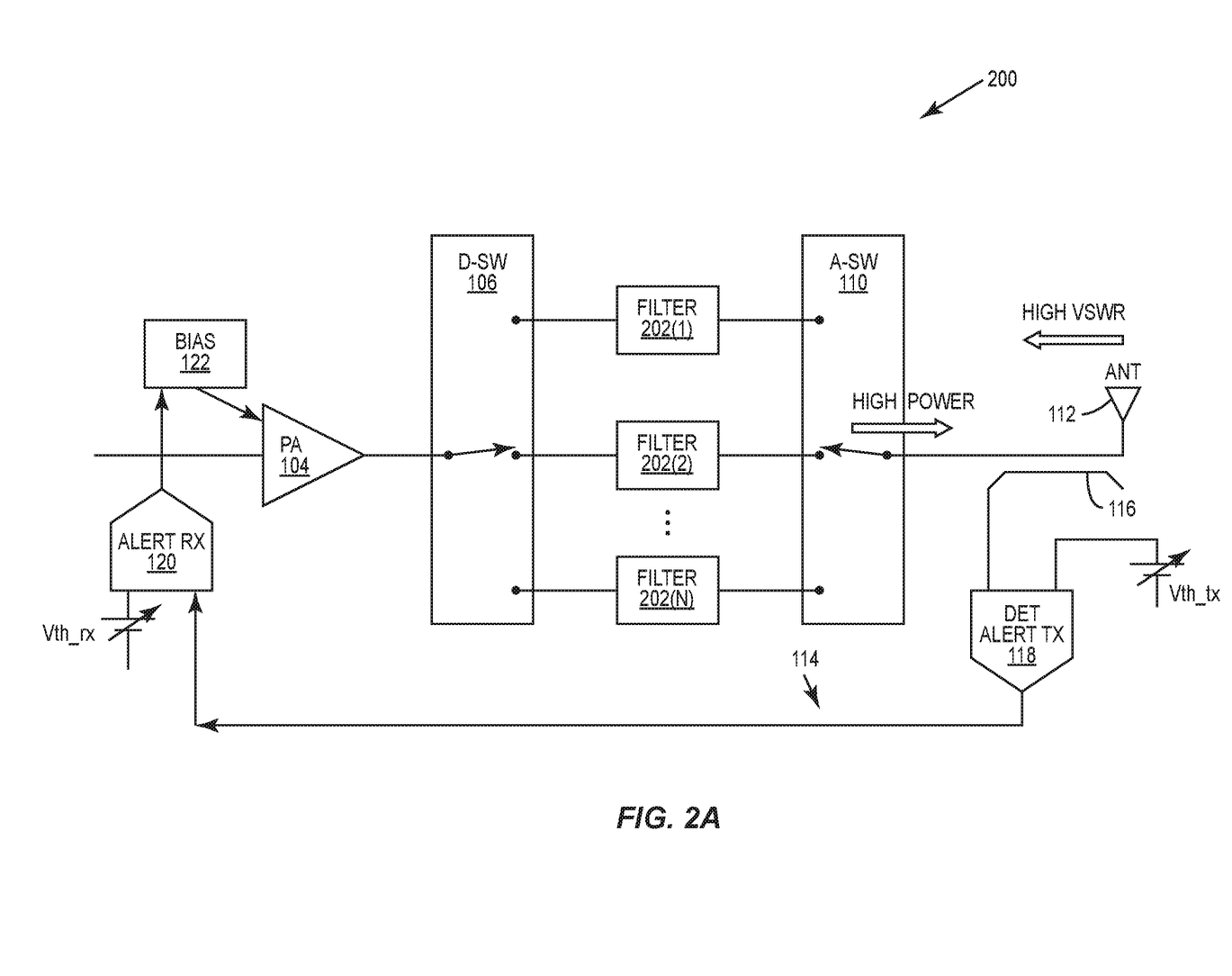
FIG. 2A is a block diagram of an exemplary transmission chain having a power amplifier stage and multiple filters and a protection circuit to protect from an over power condition.
Figure 2B:
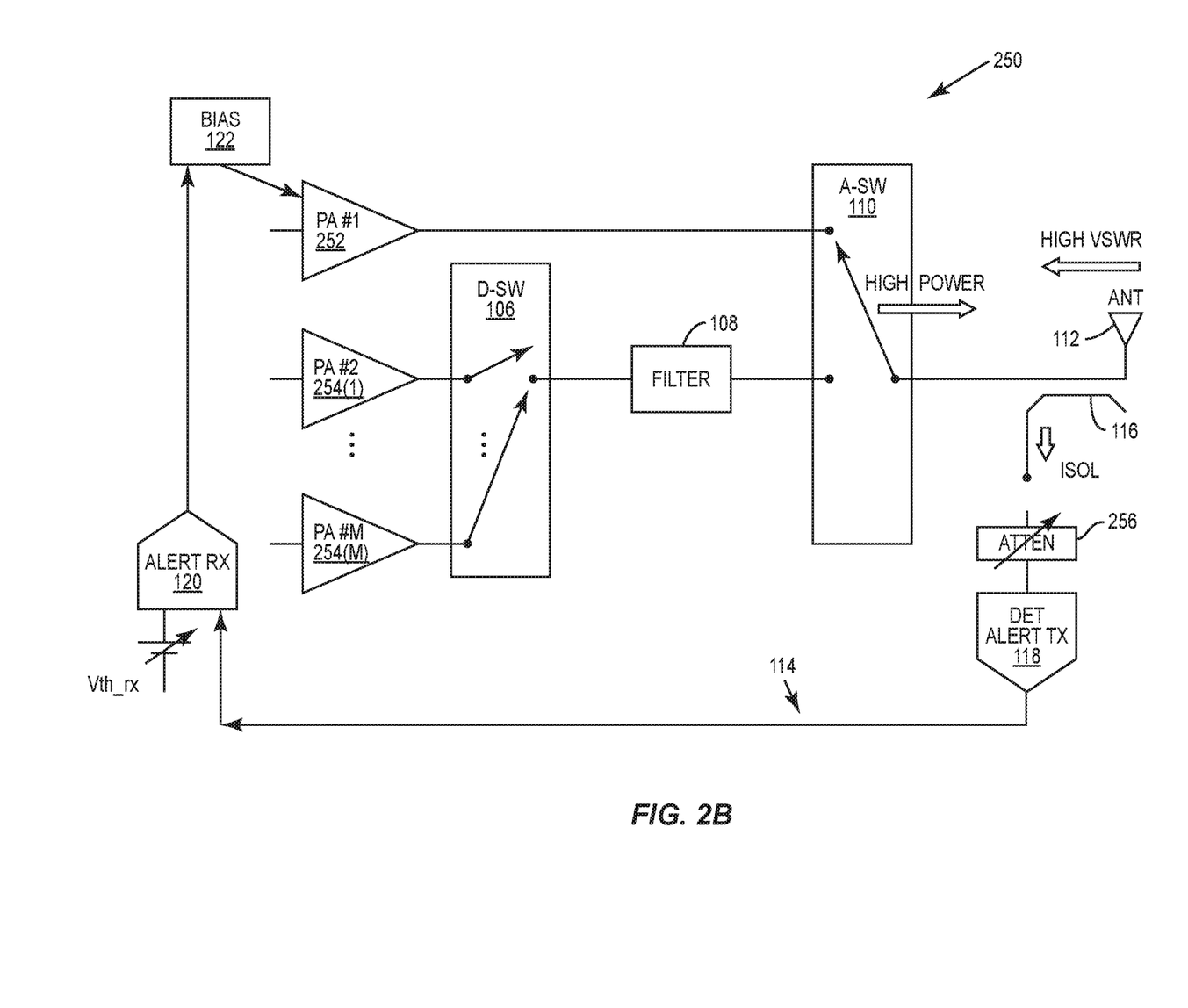
FIG. 2B is a block diagram of an exemplary transmission chain having multiple power amplifier stages and a filter and a protection circuit to protect from an over power condition.

It should be appreciated that the transmission chain may take on different topologies. For example, as shown by a transmission chain 200 in FIG. 2A, there may be a bank of filters 202(1)-202(N) between the distribution switch 106 and the antenna switch 110. Other elements of the transmission chain 200 may be substantially similar to the transmission chain 100 of FIG. 1 and are numbered the same. Likewise, instead of (or in addition to (not shown)) multiple filters, a transmission chain 250 may have a plurality of power amplifier stages 252, 254(1)-254(M) as illustrated in FIG. 2B. One or more power amplifier stages 252 may bypass the distribution switch 106 and the filter 108. This may cause additional power to be incident on the antenna 112 and reflected. However, because forward power from a power amplifier stage 252 that bypasses the filter 108 may not contribute to filter failure, an attenuation circuit 256 may be provided between the coupler 116 and the detection circuit 118 so that the detection circuit 118 is only measuring power that affects the filter 108.

Figure 3:
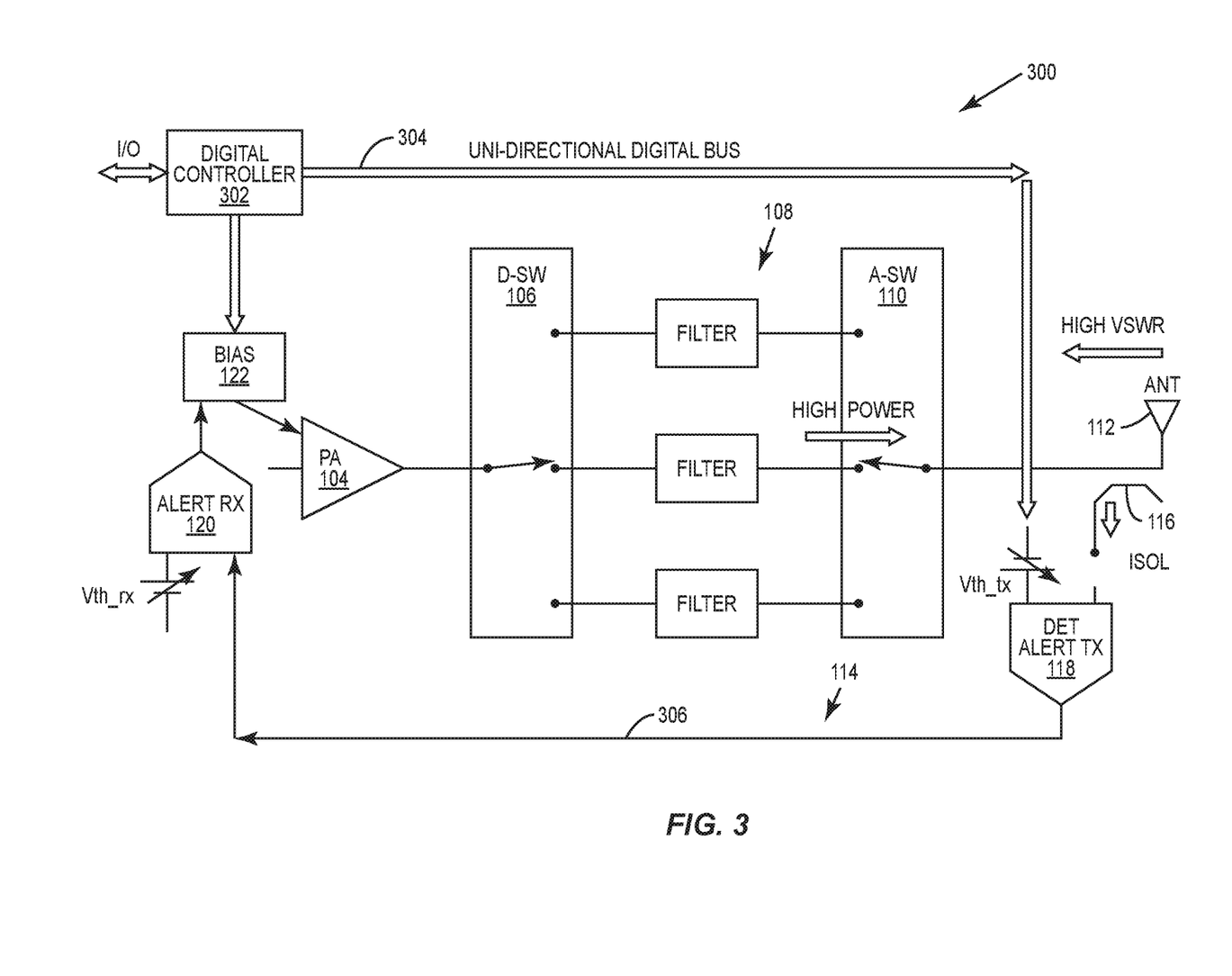
FIG. 3 is a block diagram of an exemplary transmission chain having a power amplifier stage and filters with a protection circuit highlighting possible communication channels used to control the protection circuit.
Figure 4:
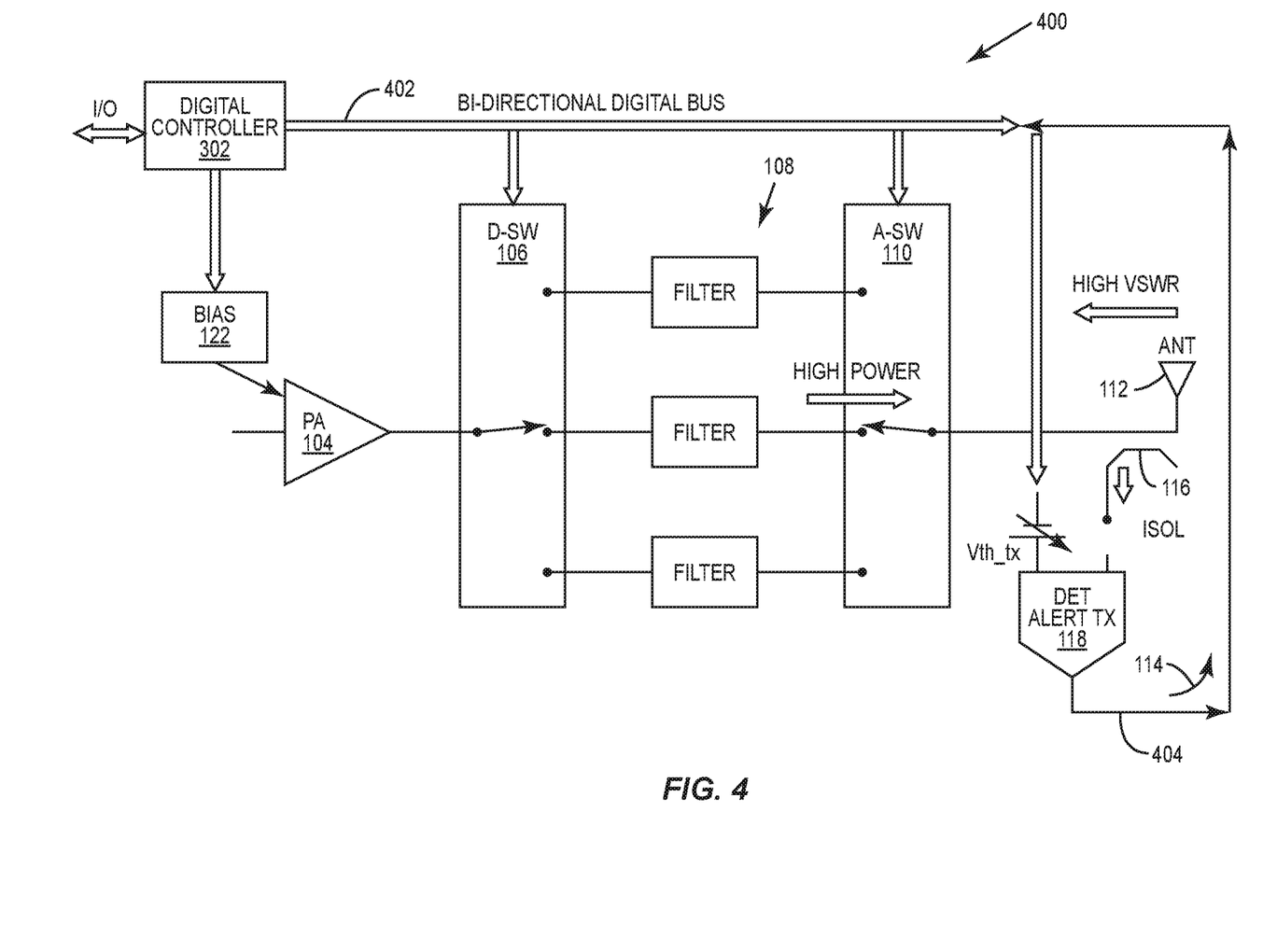
FIG. 4 is a block diagram of an exemplary transmission chain having a power amplifier stage and filters with a protection circuit highlighting possible communication channels used to control the protection circuit and report detected power levels back to a controller.

Communication between the detection circuit 118 and the bias circuit 122 may take a variety of forms as explored in FIGS. 3 and 4. In particular, FIG. 3 shows a transmission chain 300 which includes a digital controller 302. The digital controller 302 may receive instructions through an input/output (I/O) interface, which may include information about mode changes (e.g., 2G to 4G), frequency changes, or the like. The digital controller 302 may be coupled to a bus 304, which, in an exemplary aspect is uni-directional, and allows the digital controller 302 to make changes to the distribution switch 106, the antenna switch 110, the bias circuit 122, and optionally provide instructions to the detection circuit 118, such as changing threshold levels based on mode changes. The bus 304 may be a digital bus. It should be appreciated that exemplary modes include, but are not limited to, 2G, 2.5G, 3G, 4G, 5G, and 6G and may include one or more frequency bands. The detection circuit 118 may communicate with the bias circuit 122 through a dedicated conductor 306 with its own I/O pins or use some other communication path distinct from the bus 304. This communication may be analog or digital.

In contrast, a transmission chain 400 as illustrated in FIG. 4 may be similar to the transmission chain 300 of FIG. 3 with a digital controller 302, but a bus 402 may be a bi-directional bus and be coupled to the detection circuit 118 such that the detection circuit 118 may provide a digital alert signal to the digital controller 302. The digital controller 302 may subsume the need for a distinct alert circuit 120 and may control the bias circuit 122 to debias the power amplifier stage 104 based on the digital alert signal.

Figure 5:
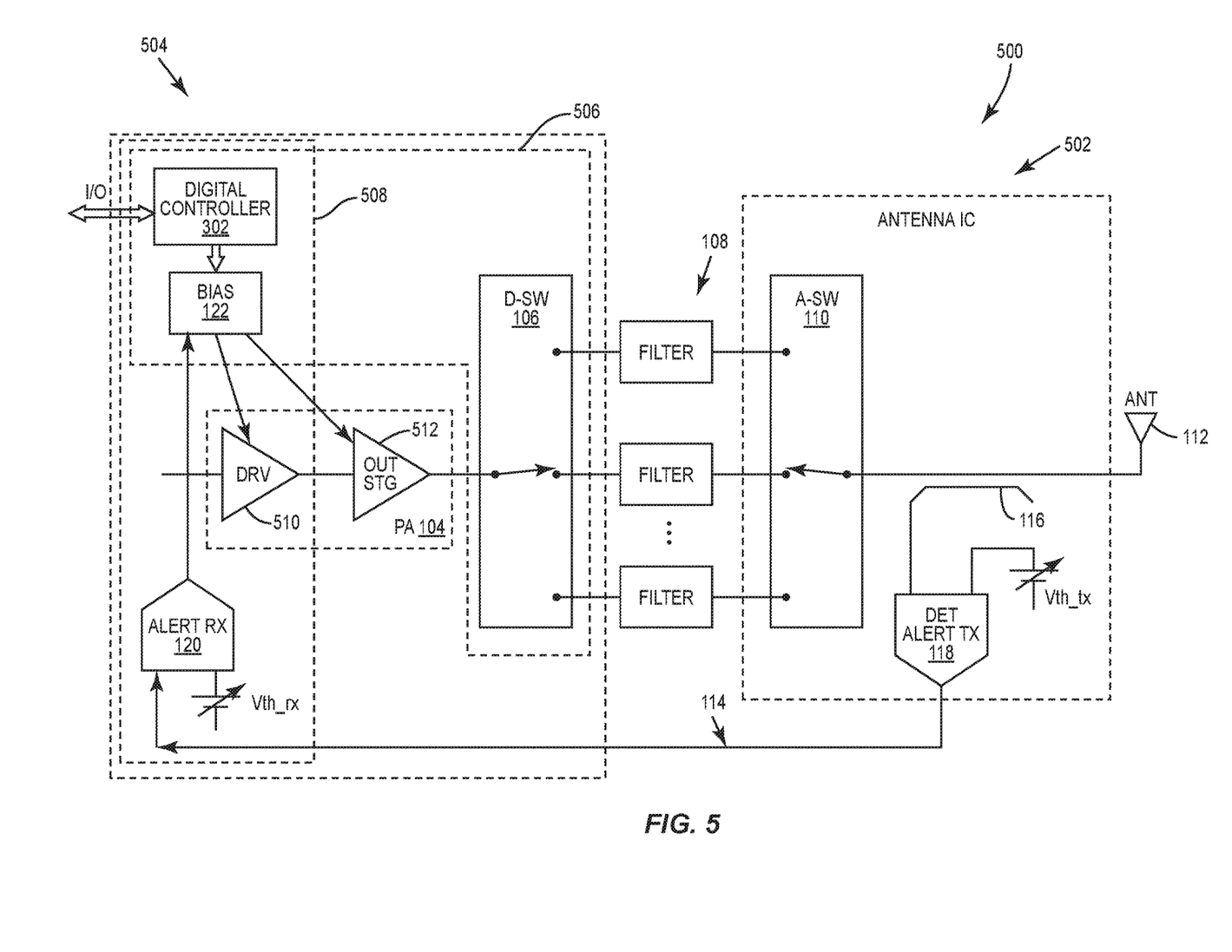
FIG. 5 is a block diagram illustrating possible die configurations for an exemplary transmission chain having a protection circuit to protect against over power conditions.

It should be appreciated that the various elements of the present disclosure may be consolidated onto a single die or may be distributed amongst a plurality of dies. The latter situation is illustrated in FIG. 5 with a transmission chain 500 including an antenna IC 502, and at least a controller IC 504. The antenna IC 502 may include the antenna switch 110, the coupler 116, and the detection circuit 118. The antenna 112 may be integrated onto the antenna IC 502 (not shown) or more likely integrated into a chassis of a mobile computing device as is well understood. The filters 108 may be provided on a laminate structure such as a printed circuit board (PCB) on which the other ICs are mounted. The laminate structure may include metallization layers which provide conductors and vias allowing interconnections between the ICs, filters 108, and antenna 112 including a conductor to allow the alert signal from the detection circuit 118 to pass to the alert circuit 120.

The controller IC 504 may optionally be a controller-distributed switch IC 506 that includes the digital controller 302, the bias circuit 122, and the distribution switch 106. In such an implementation, the power amplifier stage 104 and the alert circuit 120 may be on one distinct die or two distinct dies as needed or desired.

The controller IC 504 may, instead, optionally be a controller-power amplifier IC 508. The controller-power amplifier IC 508 may include the digital controller 302, the bias circuit 122, the power amplifier stage 104, and the alert circuit 120. The distribution switch 106 in this aspect may be on a separate distinct die.

As still another option, the controller IC 504 may include the digital controller 302, the bias circuit 122, the power amplifier stage 104, the alert circuit 120, and the distribution switch 106.

In any of the aspects, it should be appreciated that the power amplifier stage 104 may include a driver amplifier 510 and an output amplifier 512. The bias circuit 122 may bias and debias the driver amplifier 510.

Figure 6:
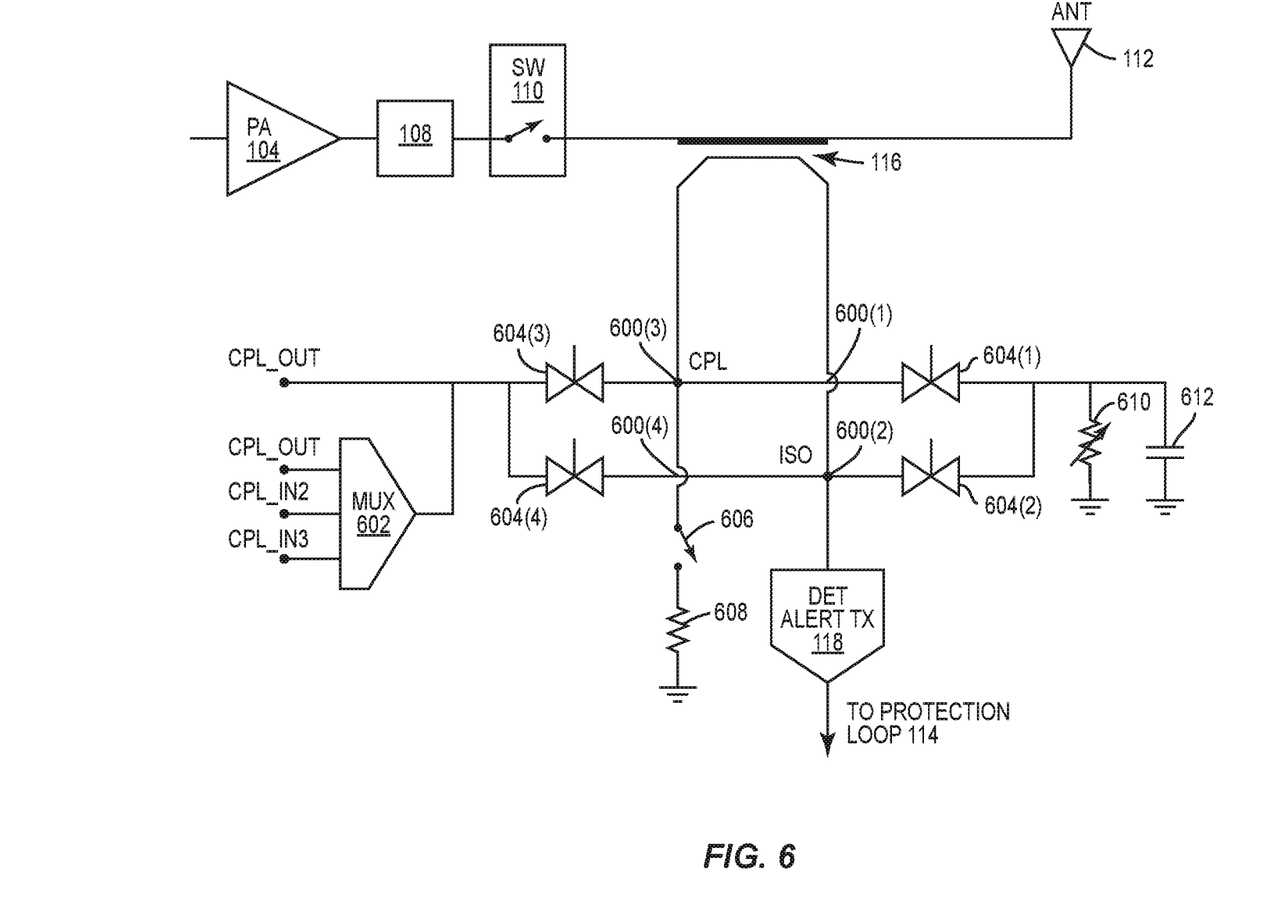
FIG. 6 is a more detailed diagram of the circuit used to detect power levels at the antenna.

FIG. 6 provides additional details about the coupler 116 and detection circuit 118. As noted above, the coupler 116 may indirectly sense current on a conductor of an antenna path that sends the signals from the antenna switch 110 to the antenna 112. The coupler 116 may be a four-port coupler with ports 600(1)-600(4). Each port 600(1)-600(4) has an associated transient voltage suppression diode 604(1)-604(4). Input signals (e.g., CPL_IN1, CPL_IN2, CPL_IN3) are provided to a multiplexer (MUX) 602. The MUX 602 provides a selected signal to the port 600(3) through the transient voltage suppression diode 604(3). Concurrently, the selected signal is provided to the detection circuit 118 through the port 600(4), which may be called an isolation port. If there is no forward signal, a switch 606 may be used to couple a termination resistance 608 to the coupler 116. This termination is relevant because absent such termination, the detection circuit 118 may measure an incorrect signal and provide an incorrect alert signal. Port 600(1) is also coupled to a variable resistor 610 and capacitor 612 that may also be used to adjust a perceived impedance to achieve a desired impedance match (or mismatch).

Figure 7:
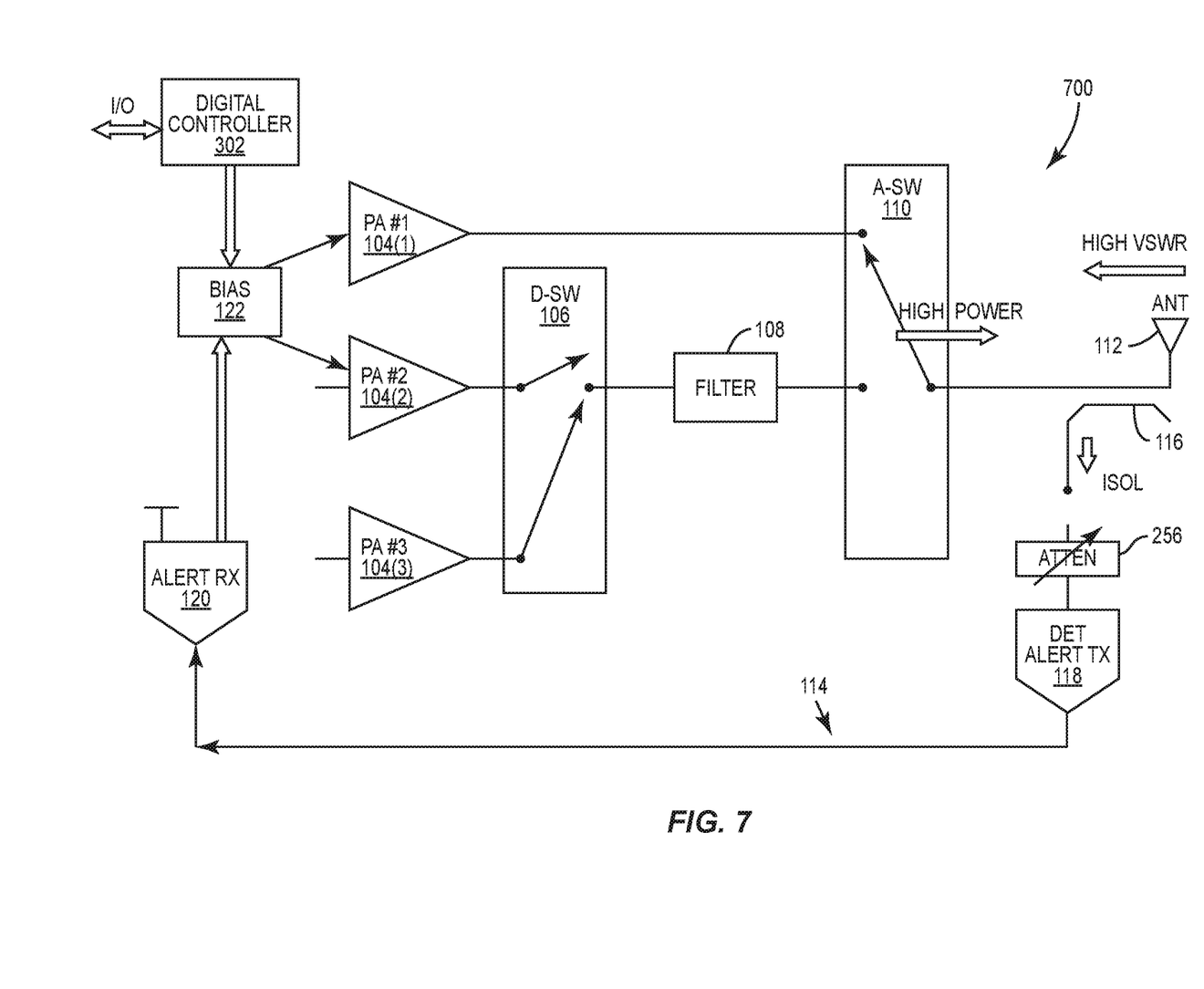
FIG. 7 is a block diagram of an exemplary transmission chain having multiple power amplifier stages that operate in different modes with a filter and a protection circuit that may adjust how protection is provided based on which mode is active.

Note that exemplary aspects of the present disclosure may be used to protect power amplifier stages, filters, or both together. For example, as illustrated in FIG. 7, a transmission chain 700 may have one or more power amplifier stages 104(1) which do not use a filter 108. Debiasing such power amplifier stage 104(1) may only protect the power amplifier stage 104(1). However, another mode of operation may use a different power amplifier stage 104(2) that passes a signal through the distribution switch 106, the filter 108, and the antenna switch 110 before being transmitted by the antenna 112. Note that these signals may have different signal strengths and/or different VSWR and different reflected signal strengths. As explained above with reference to FIG. 2B, an attenuation circuit 256 may be used and adjusted based on mode to scale the signals so as to be comparing comparable signals. For example, a first signal may be transmitted with 36 decibel-milliwatts (dBm) and a second signal transmitted with 26 dBm. The reflected signals may be at 16 dBm and 6 dBm, respectively. The attenuation circuit 256 may scale the signals appropriately.

Figure 8:
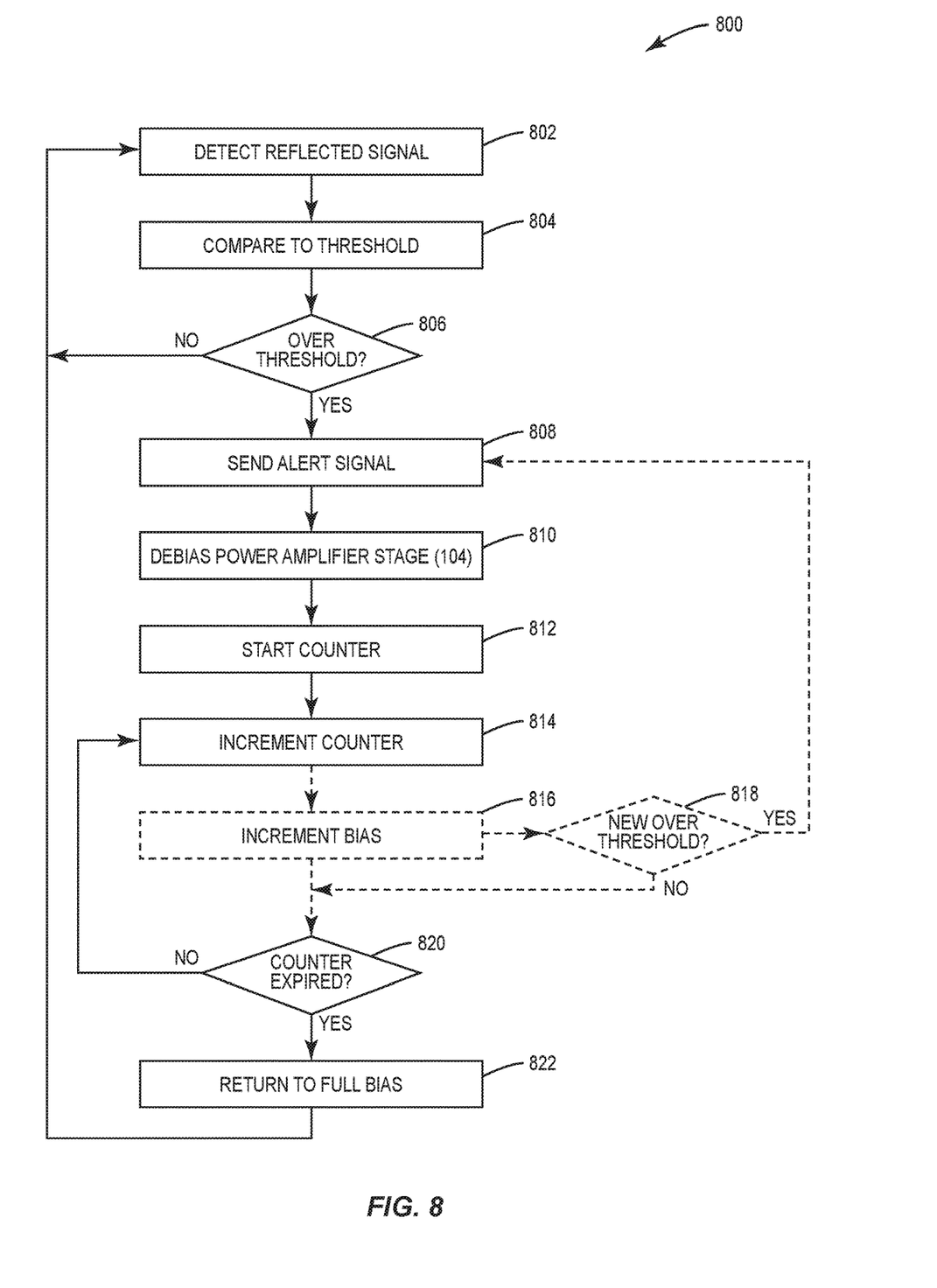
FIG. 8 is a flowchart showing how debiasing may operate based on signals from the protection circuit.

Debiasing the power amplifier stage 104 may be done a variety of ways, but one process 800 is illustrated in FIG. 8. The process 800 begins when the detection circuit 118 detects a reflected signal (block 802) and compares the reflected signal to a threshold (block 804). The detection circuit 118 determines if the reflected signal is over the threshold (block 806). If not, then the process 800 returns to the detection step (block 802). If, however, the reflected signal is over the threshold, then the detection circuit 118 sends an alert signal (block 808). The bias circuit 122 debiases the power amplifier stage (104) (block 810).

The bias circuit 122 (or the digital controller 302) may start a counter (block 812). While the counter can be a count down or count up counter, the present discussion assumes a count up counter. Accordingly, the counter increments (block 814). Optionally, the bias may be incremented as well (block 816) to increase power being sent through the power amplifier stage 104. If the bias has been increased, the detection circuit 118 may determine if there has been a new over threshold condition (block 818), in which case, the detection circuit 118 sends a new alert signal (block 808), causing a new debias of the power amplifier stage 104. If the answer to block 818 is no, or the bias was not incremented, there is a determination if the counter has expired (block 820). If the answer to block 820 is no, then the process 800 returns to increment the counter (block 814). If, however, the answer is yes, the counter has expired, then the bias circuit 122 causes a return to full bias (block 822), and the process 800 returns to block 802.

Without optional blocks 816, 818, the process 800 debiases, waits until the counter expires and then rebiases as an essentially binary operation: bias/debias. However, if optional blocks 816, 818 are used, then the bias circuit 122 may slowly add bias back to the circuitry until the bias pushes the signal over the threshold or the counter expires. Peaks in VSWR are usually transient in nature and it is possible that the incremental bias allows for return to normal operation faster, which may improve the user experience while still protecting the filter 108 and/or the power amplifier stage 104.

As a further note, debiasing may involve shutting off the power amplifier stage 104 or merely lowering a power level for the power amplifier stage 104. Still further, while the above discussion has focused on the comparison being made at the detection circuit 118, it is possible that the detection circuit 118 merely indicates the power level detected to the alert circuit 120, and the alert circuit 120 makes the comparison.

It should further be appreciated that exemplary aspects of the present disclosure may be implemented in various technologies including a heterojunction bipolar transistor (HMI gallium arsenide (GaAs), silicon germanium (SiGe), gallium nitride (GaN), indium phosphide (InP), or the like. Likewise, a complementary metal oxide semiconductor (CMOS) or hybrid CMOS-bipolar technology could be used.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will he readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A transmission chain comprising:
a power amplifier stage configured to receive a signal and output an amplified output signal;
a bias circuit coupled to the power amplifier stage and configured to selectively bias and debias the power amplifier stage to control a power level of the amplified output signal;
a filter coupled to the power amplifier stage and configured to receive the amplified output signal and output a filtered signal;
a conductor coupled to the filter and configured to be coupled to an antenna;
a four-port coupler indirectly coupled to the conductor and configured to sense current indirectly on the conductor, where sensed current is indicative of a signal reflected from the antenna, wherein each port includes an associated transient voltage suppression diode; and
a detection circuit coupled to an isolation port of the four-port coupler and configured to generate an alert signal when a reflected signal sensed by the four-port coupler exceeds a threshold;
wherein the bias circuit is configured to debias the power amplifier stage based on the alert signal.

2. The transmission chain of claim 1, further comprising an alert circuit configured to receive the alert signal from the detection circuit.

3. The transmission chain of claim 2, wherein the alert circuit is configured to compare the alert signal to the threshold and communicate an over threshold condition to the bias circuit.

4. The transmission chain of claim 1, wherein the detection circuit is configured to compare the reflected signal to the threshold and generate the alert signal based on the current sensed exceeding the threshold.

5. The transmission chain of claim 1, further comprising a digital controller and a digital bus coupling the digital controller to the detection circuit.

6. The transmission chain of claim 5, wherein the alert signal is a digital signal sent on the digital bus.

7. The transmission chain of claim 2, wherein the alert signal comprises an analog signal sent to the alert circuit.

8. The transmission chain of claim 1, further comprising a distribution switch between the power amplifier stage and the filter.

9. The transmission chain of claim 1, further comprising an antenna switch between the filter and the conductor.

10. The transmission chain of claim 1, wherein the bias circuit is in a first integrated circuit (IC), and the four-port coupler is in a second IC.

11. The transmission chain of claim 1, wherein debiasing the power amplifier stage is configured to prevent an over power condition from damaging the filter.

12. The transmission chain of claim 1, wherein debiasing the power amplifier stage is configured to prevent an over power condition from damaging the power amplifier stage.

13. The transmission chain of claim 1, wherein debiasing the power amplifier stage is configured to prevent an over power condition from damaging the filter and the power amplifier stage.

14. An integrated circuit (IC) comprising:
an antenna switch configured to receive a signal from a filter;
a conductor coupled to the antenna switch and configured to be coupled to an antenna; and
a four-port coupler configured to sense current indirectly on the conductor, where sensed current is indicative of a signal reflected from the antenna, wherein each port includes an associated transient voltage suppression diode; and
a detection circuit coupled to an isolation port of the four-port coupler and configured to generate an alert signal when a reflected signal sensed by the four-port coupler exceeds a threshold, wherein the alert signal is configured to trigger a debias of a power amplifier stage to protect the filter.

15. The IC of claim 14, wherein the four-port coupler further comprises a termination resistance and a switch selectively coupling the termination resistance to a second port.

16. The IC of claim 14, wherein the four-port coupler further comprises a variable resistor and a variable capacitor coupled to a second port.

17. The IC of claim 14, wherein the detection circuit is configured to generate a digital alert signal.

18. The IC of claim 14, wherein the detection circuit is configured to generate an analog alert signal.

19. The IC of claim 14, further comprising:
a bias circuit;
a power amplifier stage coupled to the bias circuit; and
an alert circuit configured to receive the alert signal from the detection circuit and cause the bias circuit to debias the power amplifier stage based on the alert signal.

20. The IC of claim 19, wherein the alert circuit is configured to compare the alert signal to a threshold and cause the bias circuit to debias the power amplifier stage when the alert signal exceeds the threshold.

21. The IC of claim 19, wherein the power amplifier stage comprises a plurality of power amplifier stages.

22. The IC of claim 19, wherein the bias circuit debiases the power amplifier stage to protect the power amplifier stage from an over power condition indicated by the alert signal.

23. The IC of claim 19, further comprising a distribution switch coupled to the power amplifier stage.

24. The IC of claim 19, wherein the alert circuit is configured to receive an analog alert signal.

25. The IC of claim 19, further comprising a digital controller configured to receive a digital alert signal.

* * * * *

UNITED STATES PATENT AND TRADEMARK OFFICE
CERTIFICATE OF CORRECTION

PATENT NO. : 12,170,507 B2
APPLICATION NO. : 17/589078
DATED : December 17, 2024
INVENTOR(S) : Baker Scott et al.

It is certified that error appears in the above-identified patent and that said Letters Patent is hereby corrected as shown below:

In the Specification

In Column 7, Line 47, replace "transistor (HMI" with --transistor (HBT)--.

In Column 8, Line 7, replace "will he" with --will be--.

Signed and Sealed this
Twenty-first Day of January, 2025

Coke Morgan Stewart
*Acting Director of the United States Patent and Trademark Office*